(12) United States Patent
Anzil

(10) Patent No.: US 6,236,267 B1
(45) Date of Patent: May 22, 2001

(54) LINEARIZATION FOR POWER AMPLIFIERS USING FEED-FORWARD AND FEEDBACK CONTROL

(75) Inventor: Claudio Anzil, Carlsbad, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/222,058

(22) Filed: Dec. 29, 1998

(51) Int. Cl.[7] .................................. H03F 1/26; H03C 1/02
(52) U.S. Cl. .................................................. 330/149; 332/159
(58) Field of Search ................................... 330/149, 151; 332/159–162; 455/126; 375/296, 297

(56) References Cited

U.S. PATENT DOCUMENTS

| | | | | |
|---|---|---|---|---|
| 5,493,252 | * | 2/1996 | Takai | 330/151 |
| 5,532,642 | * | 7/1996 | Takai | 330/151 |
| 5,565,814 | * | 10/1996 | Fukuchi | 330/151 |
| 5,675,286 | * | 10/1997 | Baker et al. | 455/126 |
| 5,675,288 | * | 10/1997 | Peyrotte et al. | 330/149 |
| 6,011,434 | * | 1/2000 | Sakai | 330/149 |
| 6,028,477 | * | 2/2000 | Gentzler | 330/149 |

* cited by examiner

Primary Examiner—Benny Lee
Assistant Examiner—Khanh van Nguyen
(74) Attorney, Agent, or Firm—Blakely, Sokoloff, Taylor & Zafman LLP

(57) ABSTRACT

The present invention is a method and apparatus for linearizing an output signal which is generated by a power amplifier (PA). A phase compensation on the output signal is performed using a phase feed-forward path and a phase feedback path. An amplitude compensation on the output signal is performed using an amplitude feed-forward path and an amplitude feedback path. The amplitude compensation is synchronized with the phase compensation.

40 Claims, 3 Drawing Sheets

LINEARIZATION FOR POWER AMPLIFIERS USING FEED-FORWARD AND FEEDBACK CONTROL

BACKGROUND

1. Field of the Invention

This invention relates to communication systems. In particular, the invention relates to power amplifiers.

2. Description of Related Art

An important component in a communication or signal processing system is the power amplifier (PA). A PA usually consumes a large amount of power to provide power gain to a transmitted signal. A major problem in radio frequency (RF) communication systems is the non-linearities introduced by the operation of the PA in the signal processing chain.

The non-linearity of the PA results in distortion to the transmitted signal. Higher class PA's achieve theoretically better efficiency, expressed as the ratio of the generated output radio frequency (RF) power to the consumed direct current (DC) power, but introduce significant non-linearities to the transmitted signal. The distortion is normally in the form of severe compression which distorts the amplitude of the signal. In the extreme case, the compression behaves like a hard limiter which truncates the signal at a certain threshold.

Although constant envelope waveforms possess some inherent immunity to the compression effects caused by the PA's, they still suffer from spurious consequences. In addition, amplitude modulation (AM) to phase modulation (PM) conversion is another side-effect of these PA's in which the phase modulated signals are greatly distorted. For non-constant envelope modulation schemes, such as AM, the amplitude distortion due to the PA clearly produces undesirable results.

There exist a few techniques to reduce the non-linearity effect of the PA's. One such technique is to design the PA with selective components and carefully designed internal compensating circuits. For example, balanced amplifier circuits can be combined to achieve high powers. Internally matched structures can be included to reduce parasitic effects. However, this technique increases the circuit complexity, results in expensive or bulky PA's which may not be suitable for wireless applications, and provides marginal improvement at best. Another technique is to compensate the non-linearity by using a separate filtering system which has phase and amplitude characteristics complementary to the PA characteristics. A disadvantage of this technique is the difficulty in matching both the phase and amplitude of the filter characteristics to the PA characteristics. Another disadvantage is the inability to respond to the system dynamically as the frequency or phase of the signal changes, or the characteristics of the PA or filter change (independently of one another).

Therefore there is a need in the technology to provide a simple and efficient method to linearize the characteristics of the PA without compromising power efficiency.

SUMMARY

The present invention is a method and apparatus for linearizing an output signal which is generated by a power amplifier (PA). A phase compensation on the output signal is performed using a phase feed-forward path and a phase feedback path. An amplitude compensation on the output signal is performed using an amplitude feed-forward path and an amplitude feedback path. The amplitude compensation is synchronized with the phase compensation.

In a preferred embodiment, the phase feed-forward path includes a phase control parameter generator containing control parameters to control a direct digital synthesizer and a phase-locked loop to generate the input signal to the PA. The phase feedback path includes a phase detector to generate a feedback phase error signal between the input signal to the PA and the output signal generated by the PA. The feedback phase error signal is used to update the control parameters in the phase control parameter generator. The amplitude feed-forward path includes an amplitude control parameter generator to adjust the power level of the PA based on an amplitude error. The amplitude feedback path includes an amplitude detector to detect the amplitude of the output signal, and an amplitude comparator to compare the detected output amplitude and a predetermined amplitude based on the characteristic of the desired output signal. The amplitude comparator generates the amplitude error.

BRIEF DESCRIPTION OF THE DRAWINGS

The features and advantages of the present invention will become apparent from the following detailed description of the present invention in which.

DESCRIPTION

The present invention is a method and apparatus for linearizing an output signal which is generated by a power amplifier (PA). A phase compensation on the output signal is performed using a phase feed-forward path and a phase feedback path. An amplitude compensation on the output signal is performed using an amplitude feed-forward path and an amplitude feedback path. The amplitude compensation is synchronized with the phase compensation.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
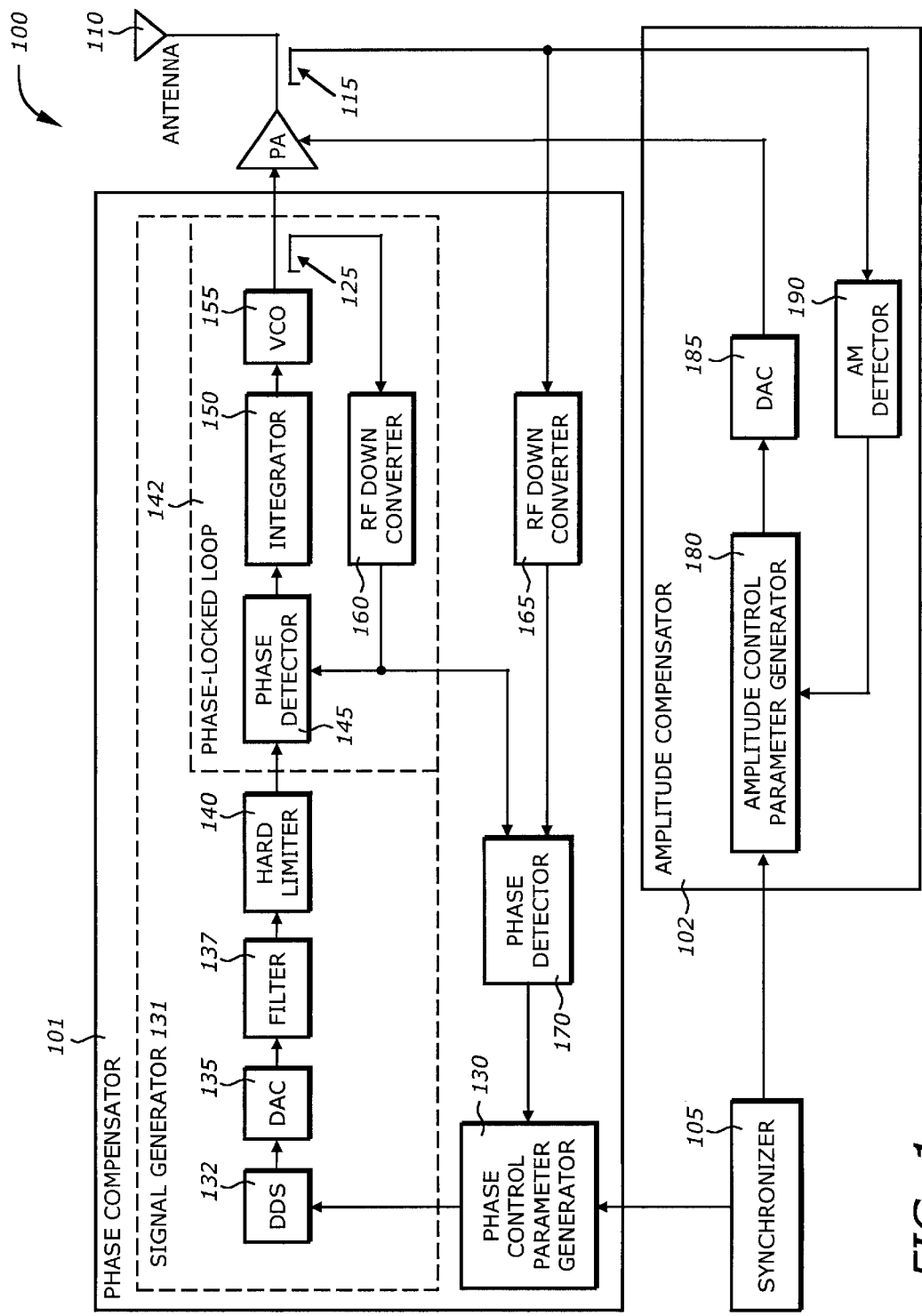
FIG. 1 is a diagram illustrating a system in which a preferred embodiment of the invention can be practiced.

FIG. 1 is a diagram illustrating a system 100 in which a preferred embodiment of the invention can be practiced. The system 100 includes a phase compensation block 101, an amplitude compensation block 102, a synchronizer 105, an antenna 110, a power amplifier (PA) 120, and two directional couplers 115 and 125.

The phase compensation block 101 compensates the phase distortion caused by the non-linearities of the PA 120. The amplitude compensation block 102 reintroduces the signal amplitude for the PA 120 compensating for the amplitude distortion. The synchronizer 105 synchronizes the operation of the phase compensation and the amplitude compensation blocks 101 and 102 to ensure the correspondence between the phase and amplitude of the signal to the PA 120.

The PA 120 generates an output signal to be transmitted via the antenna 110. The directional coupler 115 provides feedback signal from the output of the PA 120 to the phase compensator block 101 and the amplitude compensator block 102. The directional coupler 125 provides a feedback signal from the phase compensator block 101 to the phase compensator block 101 itself.

The phase compensator block 101 includes a phase control parameter generator (PCPG) 130, a signal generator 131 a second radio frequency (RF) down converter 165, and a second phase detector 170. The signal generator 131 includes a direct digital synthesizer (DDS) 132, a digital-to-analog converter (DAC) 135, a filter 137, a hard limiter 140, and a phase-locked loop 142. The phase-locked loop 142 includes a first phase detector 145, an integrator 150, a voltage-controlled oscillator (VCO) 155, and a first radio frequency (RF) down converter 160.

The phase control parameter generator (PCPG) 130 provides control parameters to the DDS 132. The PCPG 130 implements phase compensation processes to provide control signal to the DDS 132. There are essentially two types of processing: a phase feed-forward path and a phase feedback path. The phase feed-forward path provides a faster response time than the phase feedback path, but it may not be as accurate as the phase feedback path. Therefore, the phase feed-forward path affects the short-term behavior while the phase feedback path affects the long-term behavior. Combining both the phase feed-forward and the phase feedback paths will provide a stable compensation to the PA 120.

The phase feed-forward path includes the generation of control parameters in a form of a phase look-up table (LUT). The control parameters include parameters that control the DDS 132. Examples of the control parameters include output channel frequency, instantaneous phase, coefficients for digital filtering of the output of the DDS 132, and Kalman filter parameters. The digital filter may be recursive or non-recursive, although a non-recursive filter is preferred. Digital filtering is used for various reasons including providing control of the spectral purity at the output and compensating for phase and amplitude distortion in the ensuing PLL and PA. The Kalman type filter typically begins with a default or factory calibrated set of phase control parameters, and optimizes certain signal metrics (e.g., phase accuracy and spectral purity) by constantly adjusting this set of control parameters using the feedback data.

In the phase feed-forward path, the phase LUT containing the control parameters is created in advance. The initial control parameters characterize the DDS 132 in the initial state. The initial control parameters are obtained by a number of methods. One method is to create the parameters based on the default operational mode according to the design specifications. Another method is to use the actual calibration or testing data when the system is constructed or manufactured. An automatic parameter generation process can be performed by a computer or a test console based on the calibration or testing results. The control parameters are then down loaded to a configuration memory in the PCPG 130. This configuration memory may be a flash programmable read only memory (ROM) or as part of a constant data in a program embedded in the PCPG 130. In a preferred embodiment, the phase LUT is implemented as a random access memory (RAM) which can be updated by the phase feedback path. Initially, in the phase feed-forward path, the RAM LUT is initialized by transferring the contents of the configuration memory to the RAM LUT. The phase feed-forward path therefore provides a fast response time for starting up the system. Since the initial control parameters are generated based on a fairly accurate model, either using the default model or the calibration/testing results, the PCPG 130 can provide an accurate coarse mode control to the DDS 132.

The phase feedback path includes the updating of the phase LUT as the PA begins to show phase distortion as detected by the second phase detector 170. The updating process adjusts the control parameters in the RAM LUT in the direction to reduce the phase distortion. Since the latency of the feedback path is longer than the feed-forward path, the updating process preferably has some stabilizing control to avoid sudden change which may result in fluctuations in the phase compensation. For example, the parameters will not be changed significantly (e.g., less than 1% in most cases for the digital filter coefficients) at each update to allow time for the system to adjust. Other parameters may be adjusted by orders of magnitude.

The DDS 132 generates a signal to be transmitted with the specified frequency. In a preferred embodiment, the DDS 132 includes a phase accumulator and a signal look-up table (LUT). The phase accumulator accumulates the phase error as determined by the digital filter in the PCPG 130. The signal LUT is typically implemented as a read only memory (ROM) which stores the signal values for a typical waveform of the transmitted signal. Examples of the signal values include the sine values, specifying amplitudes and/or phases. As is known by one skilled in the art, other waveforms may also be generated with appropriate values in the LUT. The DDS 132 may also include a digital filter that filters the signal values. The parameters of these filters are updated by the PCPG 130.

The phase DAC 135 converts the digital values generated by the DDS 132 into a corresponding analog signal. The filter 137 smoothes the DAC output, interpolating between samples and reducing clock related spurious signals. The hard limiter 140 limits the analog signal to predetermined values. The hard limiter 140 essentially determines the edges of the signal because the first phase detector 145 operates on the phase and not on the amplitude. The first phase detector 145 compares the phase of generated signal as limited by the hard limiter 140 with the phase of the signal as generated by the VCO 155. The output of the first phase detector 145 drives the integrator 150. The integrator 150 acts like a filter to stabilize the generation of the phase error by the first phase detector 145. The integrator 150 generates an analog voltage that corresponds to the frequency of the signal to be transmitted. The VCO 155 receives the error quantity from the integrator 150 and generates the desired signal to the PA 120. The first RF down converter 160 generates the feedback signal at the frequency range of the first phase detector 145. The first RF down converter may be implemented by a number of methods. One method is using a frequency divider, such as a counter. Another method is to use a mixer followed by a low pass filter. The output of the first RF down converter 160 is also connected to the input of the second phase detector 170. The second RF down converter 165 receives a feedback signal from the PA 120 via the directional coupler 115 and converts the feedback signal into a signal that is within the operational frequency range of the second phase detector 170. The second RF down converter 165 may also be implemented in the same manner as the first RF down converter 160.

The second phase detector 170 produces a signal reflecting the difference between the phase of the signal generated by the PA 120 and the phase of the signal generated by the input to the PA 120, i.e., the signal generated by the VCO 155. The second phase detector 170 essentially provides the PCPG 130 a control signal corresponding to the phase distortion caused by the PA 120. The PCPG 130 in turn compensates for this distortion through parameter adjustment.

The amplitude compensation block 102 includes an amplitude control parameter generator (ACPG) 180, an amplitude digital to analog converter (DAC) 185, and an AM detector 190. The amplitude compensation block 102 provides amplitude control for the PA 120 and compensates the amplitude distortion caused by the PA 120. The amplitude compensation block 102 and the phase compensation block 101 are synchronized by the synchronizer 105 to be described later. The amplitude compensation block 102 has two processing paths: an amplitude feed-forward path and an amplitude feedback path. The amplitude feed-forward path includes the ACPG 180 and the amplitude DAC 185. The amplitude feedback path includes the AM detector 190.

The ACPG 180 generates the amplitude control data to the second DAC 185. The second DAC 185 converts the digital amplitude control data to an analog signal to adjust the amplitude of the signal as generated by the PA 120. The ACPG 180 and the amplitude DAC 185 essentially reinserts or reintroduces the amplitude to the transmitted signal.

The AM detector 190 receives the output signal generated by the PA 120 via the directional coupler 115 and generates a signal representative of the signal amplitude. The AM detector 190 may be implemented by an analog envelope detector as well known in the art. The output of the AM detector 190 is then compared with the predetermined amplitude as stored in the amplitude LUT in the ACPG 180.

The synchronizer 105 assures that the phase and amplitude adjustments are performed at the proper time and coherently. The synchronizer 105 may be implemented by a number of methods. One method is to use a phase-locked loop (PLL) which is slaved to the master clock, the DDS clock. The PLL adjusts the clocking to the amplitude control circuitry to apply the amplitude correction at the right time. The clock adjustment is based on the envelope observed at the output. The error between the actual envelope and the desired envelope is determined and used to correct the timing and clock circuit in the ACPG 180.

Figure 2:
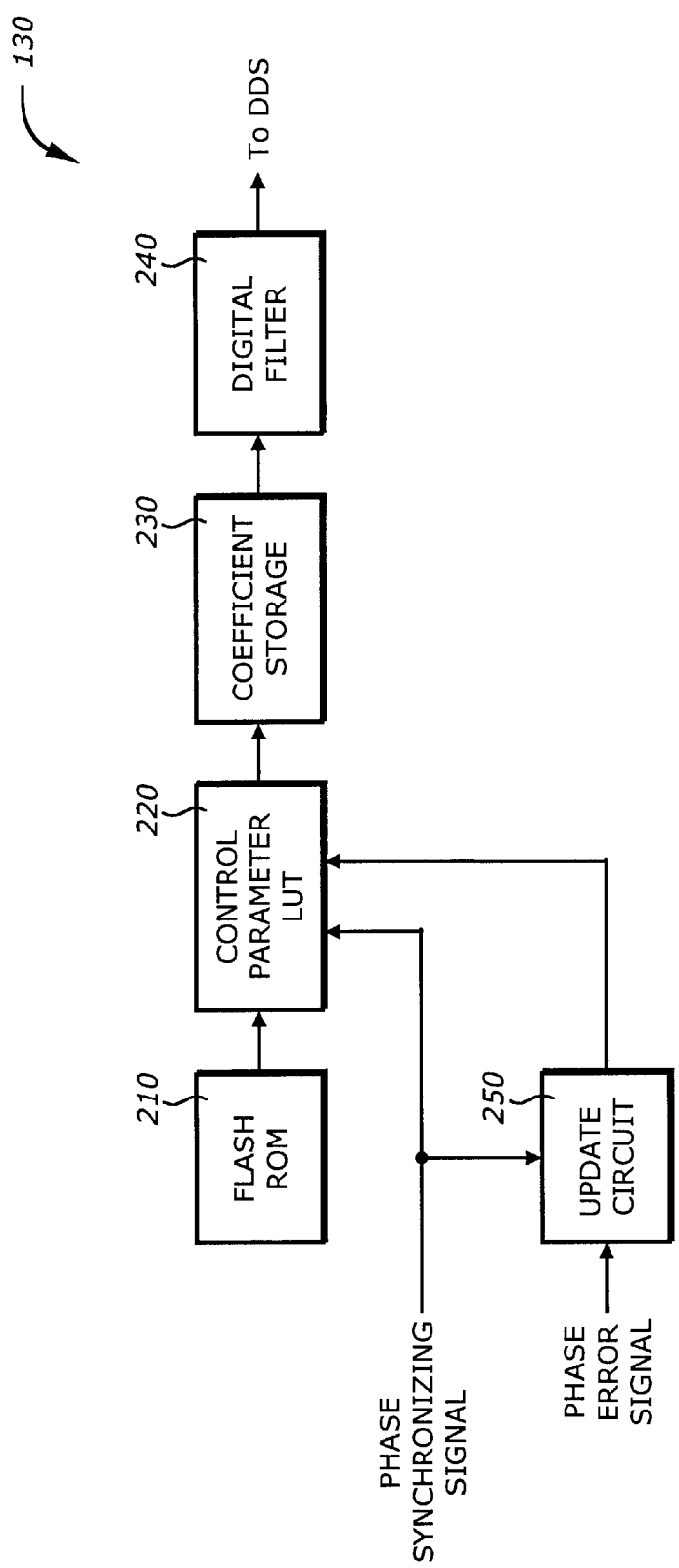
FIG. 2 is a diagram illustrating a phase control parameter generator according to a preferred embodiment of the invention.

FIG. 2 is a diagram illustrating the PCPG 130 according to a preferred embodiment of the invention. The PCPG 130 includes a flash ROM 210, a control parameter look-up table (LUT) 220, a coefficient storage 230, a digital filter 240, and an update circuit 250.

The flash ROM 210 stores the predetermined control parameters based on the default configuration of the system. These control parameters are determined according to calibration and/or testing results which reflect the particular characteristics of the system. The control parameter LUT 220 stored the control parameters in a form of RAM so that values can be updated or changed according to the feedback path. The coefficient storage 230 is the storage to store control parameters such as output channel frequency, instantaneous phase, filter coefficients, and Kalman filter parameters. As is known by one skilled in the art, other parameters can be used. The digital filter 240 provides control output data to the DDS 132 (FIG. 1) using the coefficients stored in the coefficient storage 230. The update circuit 250 receives the phase error signal from the second phase detector 170 (FIG. 1) and generates the updated values to the control parameter LUT 220. The integrator circuit 150 may be implemented by an opamp or a charge pump. The control parameter LUT 220 and the update circuit 250 are synchronized by the phase synchronizing signal from the synchronizer 105 (FIG. 1).

Figure 3:
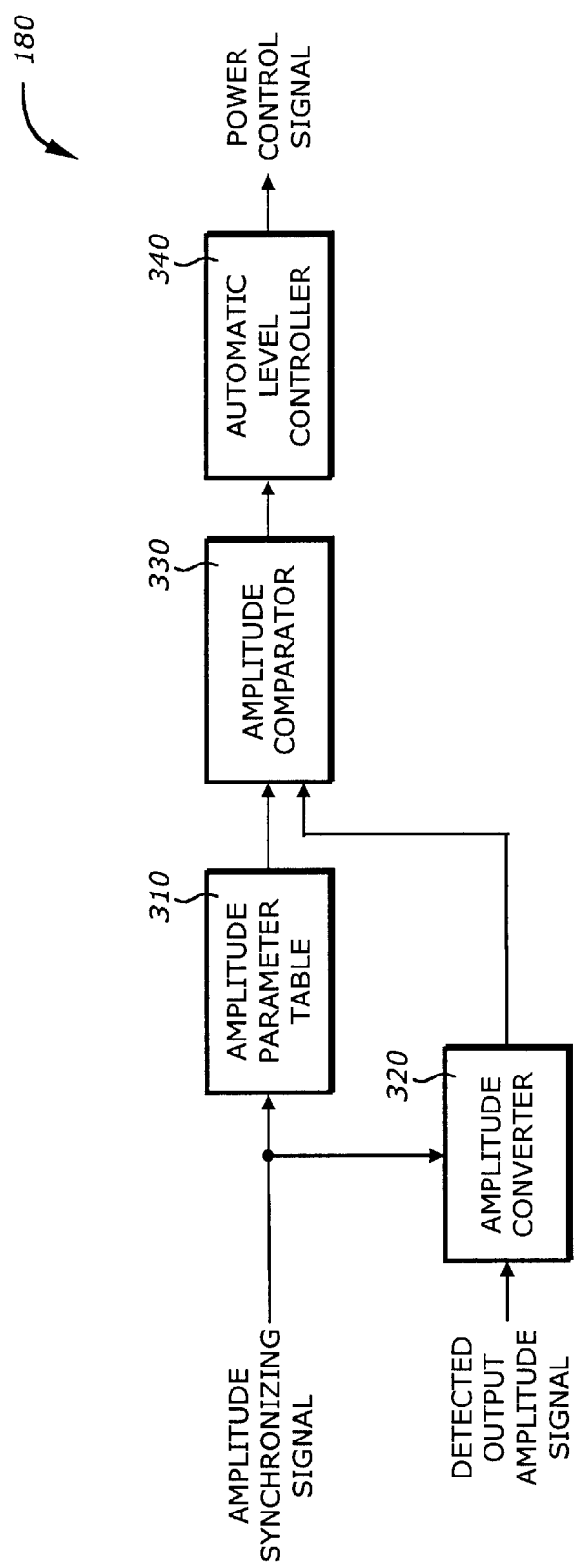
FIG. 3 is a diagram illustrating an amplitude control parameter generator according to a preferred embodiment of the invention.

FIG. 3 is a diagram illustrating an amplitude control parameter generator (ACPG) 180 according to a preferred embodiment of the invention. The ACPG 180 includes an amplitude parameter table 310, an amplitude converter 320, an amplitude comparator 330, and an automatic level controller (ALC) 340.

The amplitude parameter table 310 contains predetermined amplitude values for the generated signal. These values are determined according to the desired characteristics of the signal to be transmitted. These values may also be weighed by the particular characteristics of the PA based on calibration and/or testing results. The amplitude parameter table 310 may be implemented by a look-up table (LUT) in a form of a memory such as a random access memory (RAM) or a flash ROM. The amplitude parameter table 310 is synchronized by the amplitude synchronizing signal from the synchronizer 105 (FIG. 1).

The amplitude converter 320 converts the detected output amplitude signal from the AM detector 190 (FIG. 1) to the appropriate level and/or format for comparison with the output of the amplitude parameter table 310. The specific nature of the amplitude converter 320 depends on whether the amplitude comparator 330 is analog or digital. If the amplitude comparator is analog, the amplitude converter 320 may include the analog components such as operational amplifiers and/or programmable gain amplifier to convert the detected output amplitude signal to the appropriate level. If the amplitude comparator 330 is digital, the amplitude converter 320 may include an analog-to-digital converter to convert the detected output amplitude signal into digital data. The amplitude converter 320 is synchronized by the amplitude synchronizing signal.

The amplitude comparator 330 compares the converted output amplitude level with the predetermined amplitude level from the amplitude parameter table 310. The amplitude comparator 330 then generates an amplitude error signal to the automatic level controller 340. The amplitude comparator 330 may be analog or digital.

The automatic level controller 340 receives the amplitude error signal from the amplitude comparator 330 and generates appropriate power control signal. The power control signal is then converted to the appropriate analog control signal to the PA.

The present invention provides a simple and efficient technique to linearize a power amplifier in a wireless communication system. The technique employs a feedback and a feed-forward path to compensate both the phase and amplitude of the signal.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
   (a) performing a phase compensation on an output signal generated by a power amplifier (PA) using a phase feed-forward path and a phase feedback path;
   (b) performing an amplitude compensation on the output signal using an amplitude feed-forward path and an amplitude feedback path; and
   (c) synchronizing the phase compensation with the amplitude compensation based on time.

2. The method of claim 1 wherein performing a phase compensation comprises:
 (a1) generating a PA input signal based on control parameters in the phase feed-forward path; and
 (a2) updating the control parameters based on a result of a feedback phase comparison in the phase feedback path.

3. The method of claim 2 wherein generating a PA input signal comprises:
 generating a sequence of digital data representing a synthesized signal at a predetermined frequency by a direct digital synthesizer;
 converting the sequence of digital data into an analog signal by a phase digital-to-analog converter (DAC);
 generating an edge signal from the analog signal by a hard limiter; and
 phase locking the edge signal to generate the PA input signal by a phase-locked loop.

4. The method of claim 3 wherein phase locking comprises:
 down converting the PA input signal to a first phase signal by a first down converter;
 comparing the first phase signal with the edge signal to produce a first phase error signal by a first phase detector;
 integrating the first phase error signal to generate a control signal by an integrator; and
 generating the PA input signal based on the control signal by a voltage-controlled oscillator (VCO).

5. The method of claim 2 wherein updating the control parameters comprises:
 down converting the output signal to a second phase signal by a second down converter;
 comparing the second phase signal with the first phase signal to generate a second phase error signal by a second phase detector; and
 modifying the control parameters based on the second phase error signal.

6. The method of claim 2 wherein the control parameters are stored in a phase look-up table (LUT).

7. The method of claim 1 wherein performing an amplitude compensation comprises:
 (b1) adjusting a power level of the PA based on an amplitude control parameter in the amplitude feed-forward path;
 (b2) detecting an output amplitude of the output signal in the amplitude feedback path by an amplitude modulation (AM) detector; and
 (b3) comparing the detected output amplitude with a predetermined amplitude to generate the amplitude control parameter.

8. The method of claim 7 wherein adjusting a power level of the PA comprises:
 generating a power control data based on the amplitude control parameter; and
 converting the power control data to a power control signal by an amplitude digital-to-analog converter (DAC), the power control signal adjusting the power level of the PA.

9. The method of claim 7 wherein detecting an output amplitude includes detecting an envelope of the output signal.

10. The method of claim 7 wherein the predetermined amplitude is stored in an amplitude LUT.

11. An apparatus comprising:
 (a) a phase compensator to perform a phase compensation on an output signal generated by a power amplifier (PA) using a phase feed-forward path and a phase feedback path;
 (b) an amplitude compensator to perform an amplitude compensation on the output signal using an amplitude feed-forward path and an amplitude feedback path; and
 (c) a synchronizer coupled to the phase compensator and the amplitude compensator to synchronize the phase compensation and the amplitude compensation based on time.

12. The apparatus of claim 11 wherein the phase compensator comprises:
 (a1) a signal generator for generating a PA input signal based on control parameters in the phase feed-forward path; and
 (a2) a phase control parameter generator (PCPG) coupled to the signal generator for updating the control parameters based on a result of a feedback phase comparison in the phase feedback path.

13. The apparatus of claim 12 wherein the signal generator comprises:
 a direct digital synthesizer (DDS) for generating a sequence of digital data representing a synthesized signal at a predetermined frequency;
 a phase digital-to-analog converter (DAC) coupled to the DDS for converting the sequence of digital data into an analog signal;
 a hard limiter coupled to the phase DAC for generating an edge signal from the analog signal; and
 a phase-locked loop coupled to the hard limiter for phase locking the edge signal to generate the PA input signal.

14. The apparatus of claim 13 wherein the phase-locked loop comprises:
 a first down converter for down converting the PA input signal to a first phase signal;
 a first phase detector coupled to the first down converter for comparing the first phase signal with the edge signal to produce a first phase error signal;
 an integrator coupled to the first phase detector for integrating the first phase error signal to generate a control signal; and
 a voltage-controlled oscillator (VCO) coupled to the integrator for generating the PA input signal based on the control signal.

15. The apparatus of claim 12 wherein the phase feedback path comprises:
 a second down converter coupled to the PA for down converting the output signal to a second phase signal;
 a second phase detector coupled to the first and second down converters for comparing the second phase signal with the first phase signal to generate a second phase error signal; and
 wherein the phase control parameter generator modifies the control parameters based on the second phase error signal.

16. The apparatus of claim 12 wherein the control parameters are stored in a phase look-up table (LUT).

17. The apparatus of claim 11 wherein the amplitude compensator comprises:
 (b1) an amplitude DAC coupled to the PA for adjusting a power level of the PA based on an amplitude control parameter in the amplitude feed-forward path;

(b2) an amplitude modulation (AM) detector coupled to the PA for detecting an output amplitude of the output signal in the amplitude feedback path; and (b3) an amplitude control parameter generator (ACPG) coupled to the AM detector for comparing the detected output amplitude with a predetermined amplitude to generate the amplitude control parameter.

18. The apparatus of claim 17 wherein the ACPG comprises:

an amplitude parameter table for storing predetermined amplitude values;

an amplitude converter for converting the detected output amplitude to an amplitude signal level compatible with the predetermined amplitude values;

an amplitude comparator coupled to the amplitude parameter table and the amplitude converter for comparing the predetermined amplitude values and the converted amplitude signal, the amplitude comparator generating a control level; and an automatic level controller coupled to the amplitude comparator for generating a power control signal.

19. The apparatus of claim 17 wherein the AM detector includes an envelope detector.

20. The apparatus of claim 17 wherein the predetermined amplitude is stored in an amplitude LUT.

21. A communication system comprising:

an antenna for transmitting an output signal;

a power amplifier (PA) coupled to the antenna for generating the output signal;

a linearizing circuit coupled to the PA to linearize the output signal generated by the PA, the linearizing circuit comprising:

(a) a phase compensator to perform a phase compensation on the output signal using a phase feed-forward path and a phase feedback path;

(b) an amplitude compensator to perform an amplitude compensation on the output signal using an amplitude feed-forward path and an amplitude feedback path; and (c) a synchronizer coupled to the phase compensator and the amplitude compensator to synchronize the phase compensation and the amplitude compensation based on time.

22. The communication system of claim 21 wherein the phase compensator comprises:

(a1) a signal generator for generating a PA input signal based on control parameters in the phase feed-forward path; and (a2) a phase control parameter generator (PCPG) coupled to the signal generator for updating the control parameters based on a result of a feedback phase comparison in the phase feedback path.

23. The communication system of claim 22 wherein the signal generator comprises:

a direct digital synthesizer (DDS) for generating a sequence of digital data representing a synthesized signal at a predetermined frequency;

a phase digital-to-analog converter (DAC) coupled to the DDS for converting the sequence of digital data into an analog signal;

a hard limiter coupled to the phase DAC for generating an edge signal from the analog signal; and a phase-locked loop coupled to the hard limiter for phase locking the edge signal to generate the PA input signal.

24. The communication system of claim 23 wherein the phase-locked loop comprises:

a first down converter for down converting the PA input signal to a first phase signal;

a first phase detector coupled to the first down converter for comparing the first phase signal with the edge signal to produce a first phase error signal;

an integrator coupled to the first phase detector for integrating the first phase error signal to generate a control signal; and a voltage-controlled oscillator (VCO) coupled to the integrator for generating the PA input signal based on the control signal.

25. The communication system of claim 22 wherein the phase feedback path comprises:

a second down converter coupled to the PA for down converting the output signal to a second phase signal;

a second phase detector coupled to the first and second down converters for comparing the second phase signal with the first phase signal to generate a second phase error signal; and wherein the phase control parameter generator modifies the control parameters based on the second phase error signal.

26. The communication system of claim 22 wherein the control parameters are stored in a phase look-up table (LUT).

27. The communication system of claim 21 wherein the amplitude compensator comprises:

(b1) an amplitude DAC coupled to the PA for adjusting a power level of the PA based on an amplitude control parameter in the amplitude feed-forward path;

(b2) an amplitude modulation (AM) detector coupled to the PA for detecting an output amplitude of the output signal in the amplitude feedback path; and (b3) an amplitude control parameter generator (ACPG) coupled to the AM detector for comparing the detected output amplitude with a predetermined amplitude to generate the amplitude control parameter.

28. The communication system of claim 27 wherein the ACPG comprises:

an amplitude parameter table for storing predetermined amplitude values;

an amplitude converter for converting the detected output amplitude to an amplitude signal level compatible with the predetermined amplitude values;

an amplitude comparator coupled to the amplitude parameter table and the amplitude converter for comparing the predetermined amplitude values and the converted amplitude signal, the amplitude comparator generating a control level; and an automatic level controller coupled to the amplitude comparator for generating a power control signal.

29. The communication system of claim 27 wherein the AM detector includes an envelope detector.

30. The communication system of claim 27 wherein the predetermined amplitude is stored in an amplitude LUT.

31. A method comprising:

transmitting the output signal via an antenna;

generating the output signal by a power amplifier (PA);

linearizing the output signal generated by the PA by a linearizing circuit, the linearizing comprising:

(a) performing a phase compensation on the output signal by a phase compensator using a phase feed-forward path and a phase feedback path;

(b) performing an amplitude compensation on the output signal by an amplitude compensator using an amplitude feed-forward path and an amplitude feedback path; and (c) synchronizing the phase compensation and the amplitude compensation by a synchronizer based on time.

32. The method of claim 31 wherein performing the phase compensation comprises:

(a1) generating a PA input signal based on control parameters in the phase feed-forward path by a signal generator; and (a2) updating the control parameters based on a result of a feedback phase comparison in the phase feedback path by a phase control parameter generator (PCPG).

33. The method of claim 32 wherein generating a PA input signal comprises:

generating a sequence of digital data representing a synthesized signal at a predetermined frequency by a direct digital synthesizer (DDS);

converting the sequence of digital data into an analog signal by a phase digital-to-analog converter (DAC);

generating an edge signal from the analog signal by a hard limiter; and phase locking the edge signal to generate the PA input signal by a phase-locked loop.

34. The method of claim 33 wherein the phase locking comprises:

down converting the PA input signal to a first phase signal by a first down converter; comparing the first phase signal with the edge signal to produce a first phase error signal by a first phase detector;

integrating the first phase error signal to generate a control signal by an integrator; and generating the PA input signal based on the control signal by a voltage-controlled oscillator (VCO).

35. The method of claim 32 wherein updating in the phase feedback path comprises:

down converting the output signal to a second phase signal by a second down converter;

comparing the second phase signal with the first phase signal to generate a second phase error signal by a second phase detector; and modifying the control parameters based on the second phase error signal by the phase control parameter generator.

36. The method of claim 32 wherein the control parameters are stored in a phase look-up table (LUT).

37. The method of claim 31 wherein performing an amplitude compensation comprises:

(b1) adjusting a power level of the PA based on an amplitude control parameter in the amplitude feed-forward path by an amplitude DAC;

(b2) detecting an output amplitude of the output signal in the amplitude feedback path by an amplitude modulation (AM) detector; and (b3) comparing the detected output amplitude with a predetermined amplitude to generate the amplitude control parameter by an amplitude control parameter generator (ACPG).

38. The method of claim 37 wherein comparing the detected output amplitude with a predetermined output comprises:

storing predetermined amplitude values by an amplitude parameter table;

converting the detected output amplitude to an amplitude signal level compatible with the predetermined amplitude values by an amplitude converter;

comparing the predetermined amplitude values and the converted amplitude signal by an amplitude comparator, the amplitude comparator generating a control level; and generating a power control signal by an automatic level controller.

39. The method of claim 37 wherein detecting an output amplitude includes detecting an envelope detector.

40. The method of claim 37 wherein the predetermined amplitude is stored in an amplitude LUT.

* * * * *